(12) United States Patent
Ou Yang et al.

(10) Patent No.: US 8,174,842 B2
(45) Date of Patent: May 8, 2012

(54) LIGHT-EMITTING DIODE MODULE

(75) Inventors: Hung-Yi Ou Yang, Taipei County (TW); Wen-Yu Lin, Taipei (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 422 days.

(21) Appl. No.: 12/495,818

(22) Filed: Jul. 1, 2009

(65) Prior Publication Data

US 2010/0259928 A1    Oct. 14, 2010

(30) Foreign Application Priority Data

Apr. 8, 2009   (TW) ................................ 98205685 U

(51) Int. Cl.
*H05K 7/02*    (2006.01)
*H05K 7/06*    (2006.01)
*H05K 7/08*    (2006.01)
*H05K 7/10*    (2006.01)

(52) U.S. Cl. .................... 361/782; 361/793; 361/784
(58) Field of Classification Search .......... 361/782–784; 362/540–544

See application file for complete search history.

(56) References Cited

U.S. PATENT DOCUMENTS

| | | | | |
|---|---|---|---|---|
| 6,641,294 B2* | 11/2003 | Lefebvre | .................. | 362/544 |
| 7,064,673 B1* | 6/2006 | Bonham | .................. | 340/815.4 |
| 7,810,955 B2* | 10/2010 | Stimac et al. | .................. | 362/294 |
| 2004/0195979 A1* | 10/2004 | Plotz et al. | .................. | 315/291 |
| 2007/0263385 A1* | 11/2007 | Fan | .................. | 362/252 |
| 2008/0244944 A1* | 10/2008 | Nall et al. | .................. | 40/544 |

FOREIGN PATENT DOCUMENTS

TW    M335624    7/2008

* cited by examiner

*Primary Examiner* — Tuan T Dinh
(74) *Attorney, Agent, or Firm* — Winston Hsu; Scott Margo

(57) ABSTRACT

A light-emitting diode (LED) module includes a plurality of LED units and a converter having a first side. The LED units respectively include a circuit board having a second side perpendicular to the first side and a third side parallel to the first side, a plurality of LEDs positioned on the circuit board, and a connector positioned on the second side proximal to the converter. The LED module further includes a plurality of flexible flat cables (FFCs) used to electrically connect the connectors to the converter, respectively.

2 Claims, 8 Drawing Sheets

LIGHT-EMITTING DIODE MODULE

BACKGROUND OF THE INVENTION

1. Field of the Invention

The present invention relates to a light-emitting diode (LED) module, and more particularly, to a LED module capable of improving reliability and reducing electricity consumption.

2. Description of the Prior Art

LED light source possesses advantages of light weight, power-saving, fast response, and long lifetime. With improvement in the luminance of LED, more and more lighting products adopt LED as light source. For example, LED serving as light source is widely found in information technology products, communication products, consumer electronics products, cars, signal lamps, commercial signboards, and general lighting products.

LED light sources in the market can be classified to LED bulbs, LED light bars and LED light plates according to different practical types. Please refer to FIG. 1, which is a schematic diagram of a portion of a conventional LED light plate unit. The LED light plate unit 110 has a plurality of LEDs 114 mounted on a surface of a circuit board 112 by surface mount technology (SMT). The LEDs 114 are electrically connected to a circuit layout formed in the circuit board 112 by solders (not shown). And the LEDs 114 are therefore electrically connected to a connector 116 by the circuit layout. The connector 116 is electrically connected to a driving circuit and a converter by a flexible flat cable (FFC). Accordingly, the LED light plate units 110 can be manufactured by mass modular production and the cost is economized.

The LED light plate units 110 of a conventional LED module possess identical design due to mass modular production, thus are benefited from lower cost. However, when assembling the LED light plate units 110, the connectors 116 of the LED light plate units 110 must be avoided from the light-emitting region of the LED module. Therefore the connector 116 is arranged in the peripheral region of the LED module. Consequently, longer FFC is needed for electrically connecting the connector 116 and the converter. It is well known that longer FFC consumes more electricity and thus suffers higher cost, and reliability of longer FFC is easily adversely influenced due to damage to the longer FFC. Furthermore, with demands for the larger-scale lighting products, longer and longer FFCs are needed for electrically connecting each LED light plate units according to the conventional arrangement of the LED module. Therefore problems in reliability and electricity consumption are more deteriorated.

Accordingly, an arrangement designed for the LED light plate units and LED module adopted said arrangement that supports mass modular production and avoids aforementioned problems are still needed.

SUMMARY OF THE INVENTION

The present invention provides an LED module supporting mass modular production and preventing problems occurred in reliability and electricity consumption.

According to the claimed invention, an LED module is provided. The LED module comprises a converter having a first side, a plurality of LED units, and a plurality of flexible flat cables (FFCs). Each of the LED units comprises a circuit board having a second side perpendicular to the first side and a third side parallel to the first side, a plurality of LEDs positioned on the circuit board, and a connector positioned proximal to the converter on the second side of the circuit board and electrically connected to the LEDs. The FFCs electrically connect the connectors to the converter, respectively.

According to the claimed invention, another LED module is provided. The LED module comprises a converter having a first side, a first LED unit, a second LED unit, a first FFC, and a second FFC. The first LED unit comprises a first circuit board having a first circuit layout and a second circuit layout, a plurality LEDs positioned on the first circuit board; and a first connector and a second connector positioned on the first circuit board, the first connector is electrically connected to the LEDs by the first circuit layout. The second LED unit comprises a second circuit board having a third circuit layout, a plurality of LEDs positioned on the second circuit board, and a third connector positioned on the second circuit board and electrically connected to the LEDs by the third circuit layout. The first FFC electrically connects the first connector to the converter; and the second FFC electrically connects the third connector to the second connector. Furthermore, the second connector is electrically connected to the first connector by the second circuit layout and electrically connected to the converter by the first connector and the first FFC.

According to the LED module provided by the present invention, the length of the required FFC is reduced, therefore reliability of the LED module is improved. More important, the provided LED module still supports the mass modular production of the LED units. When large-scale application or different assembly of the LED units is required, the provided LED module is more flexible in modification by arranging different modularized LED units.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

Figure 1:
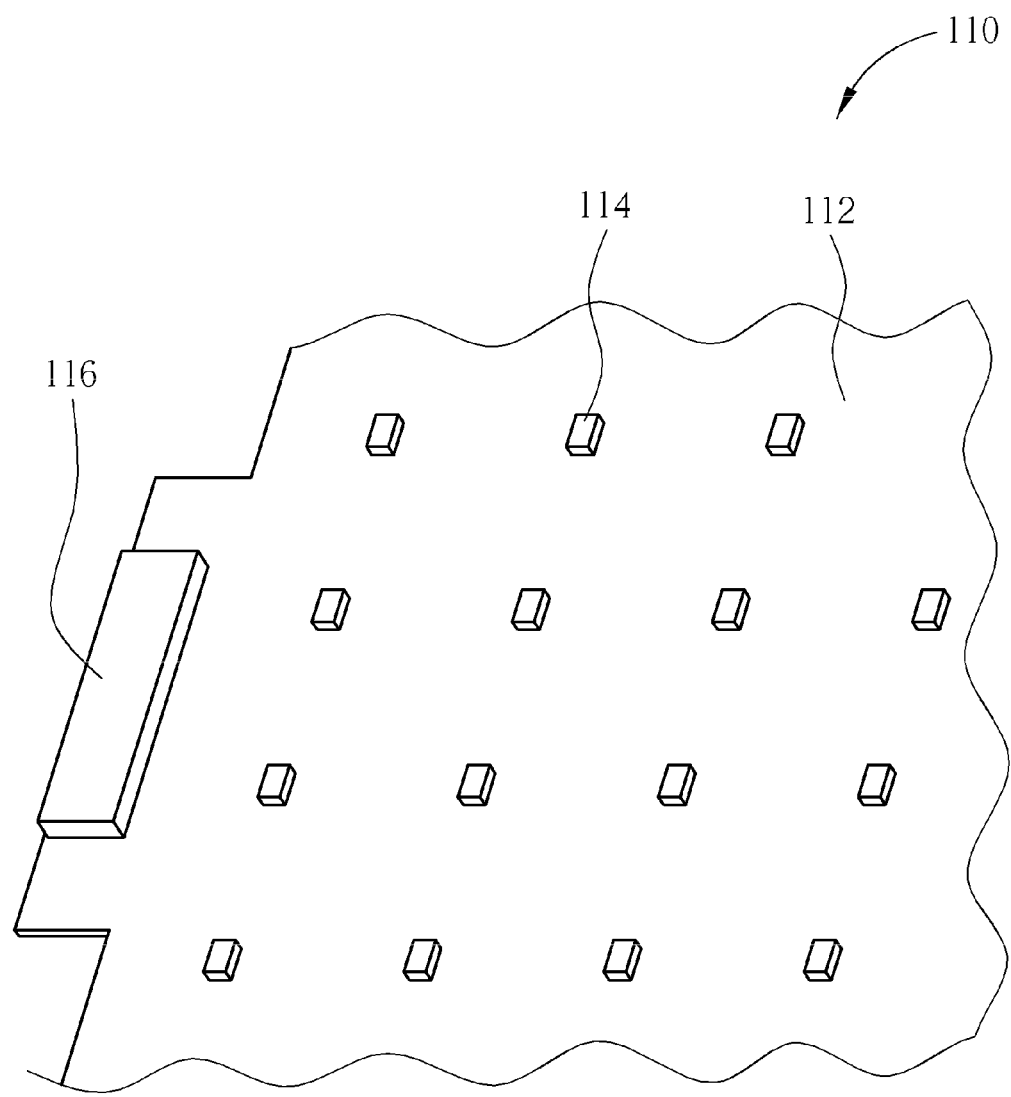
FIG. 1 is a schematic diagram of a portion of a conventional LED light plate unit.
Figure 2:
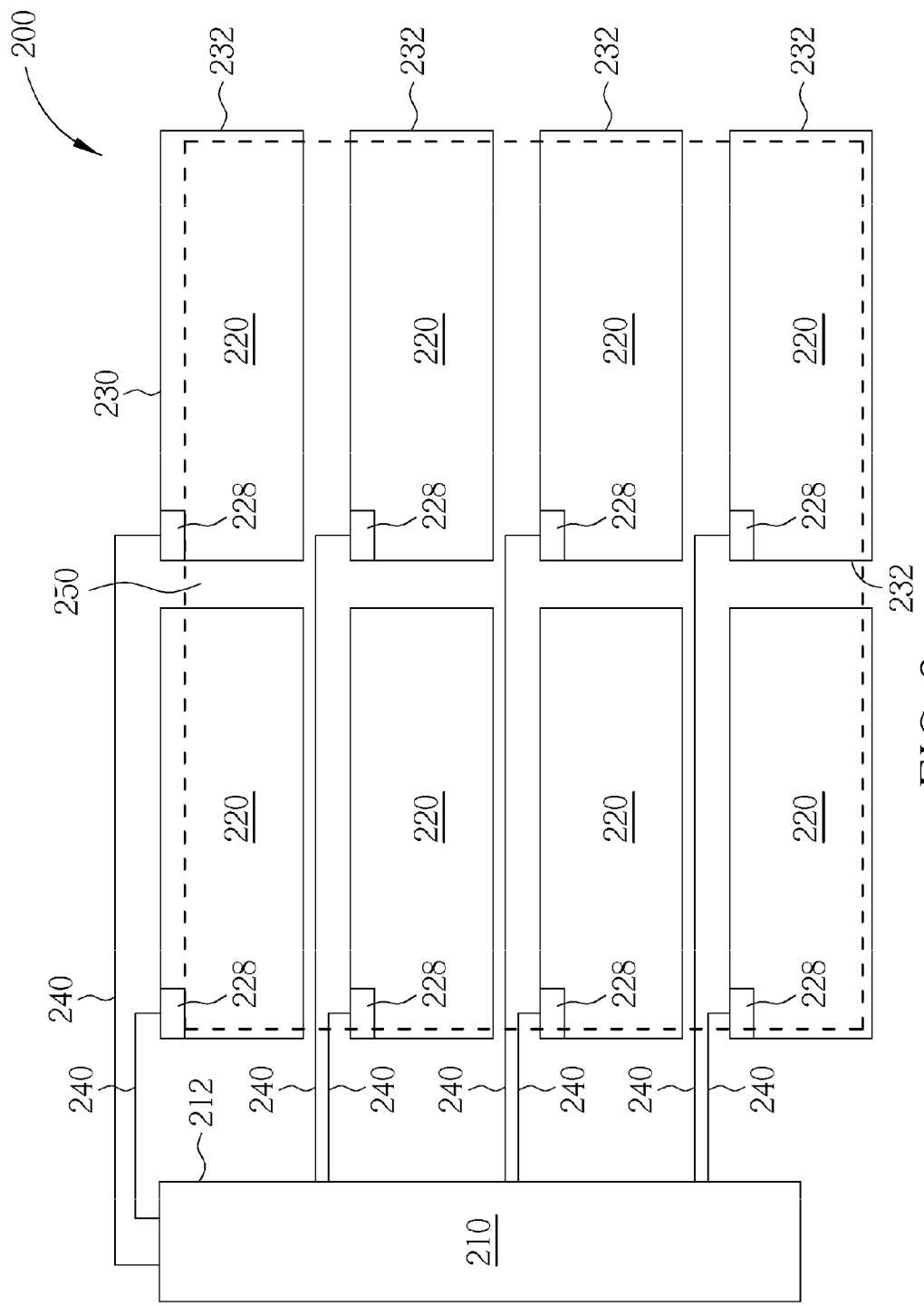
FIG. 2 is a schematic diagram illustrating connections of an LED module provided by a first preferred embodiment of the present invention.
Figure 3:
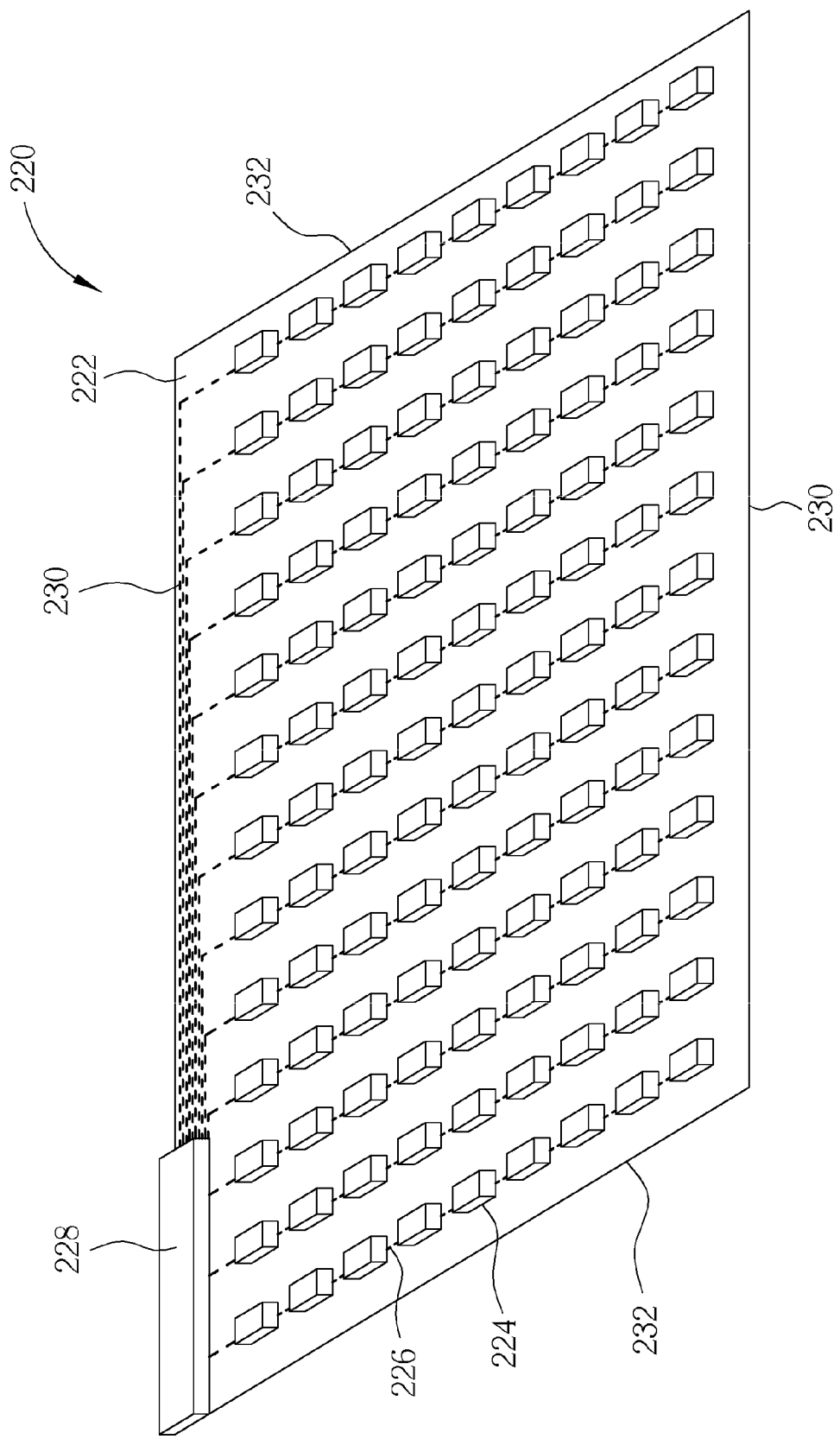
FIG. 3 is a schematic diagram of a portion of the LED module of the first preferred embodiment.

Please refer to FIGS. 2-3, FIG. 2 is a schematic diagram illustrating connections of an LED module provided by a first preferred embodiment of the present invention; FIG. 3 is a schematic diagram of a portion of the LED module of the first preferred embodiment. As shown in FIG. 2, the provided LED module 200 comprises a converter 210 having a first side 212 and a plurality of LED units 220. As shown in FIG. 3, each of the LED units 220 comprises a circuit board 222 having a plurality of LEDs 224 positioned thereon, a circuit layout 226, and a connector 228. The circuit board 222 also comprises a pair of second sides 230 and a pair of third sides 232. The second sides 230 are perpendicular to the first side 212 of the converter 210 and the third sides 232 are parallel to the first side 212 of the converter 210. It is noteworthy that the connector 228 is electrically connected to the LEDs 224 and positioned on the second side 230 of the circuit board 222, and is preferably proximal to the converter 210. The LED module 200 also comprises a plurality of FFCs 240 electrically connect the connectors 228 to the converter 210, respectively. As shown in FIG. 2, the LED module 200 further comprises a light-emitting region 250 and the LED units 220 are positioned in a rectangular array in the light-emitting region 250.

The LEDs 224 of each LED units 220 are mounted on the circuit board 222 by SMT and electrically connected to the circuit layout 226 by solders (not shown). Consequently, the LEDs 224 are electrically connected to the connector 228 by the circuit layout 226. It is well-known to those skilled in the art that when the connector 228 and the LEDs 224 are positioned on opposite surfaces of the circuit board 222, two processes for forming solders that used to electrically connect the connector 228 and the LEDs 224 are needed. The drawbacks of said design are increase in cost and deterioration in the reliability. Therefore the LEDs 224 and the connector 228 of the LED units 220 provided by the invention are positioned on the same surface of the circuit board 222.

As mentioned above, since the connector 228 is positioned proximal to the converter 210 on the second side 230 of the circuit board 222, the length of the FFC 240 used to electrically connect the converter 210 and the connector 228 is reduced. Comparing with the FFC used in the conventional LED module, said FFC has a length substantially equal to the length of the conventional LED module. Different from the conventional LED module, the length of the FFC 240 of the LED module 200 provided by the first preferred embodiment is obviously reduced while the LED units 220 are manufactured by mass modular production.

In addition, the LED module 200 provided by the first preferred embodiment further comprises a plurality of reflectors (shown in FIG. 6) respectively covering the connectors 228 and the FFCs 240 in the light-emitting region 250. The reflector can be step-shaped, sphere, or pyramid-shaped. Although the connectors 228 and the FFCs 240 in the light-emitting region 250 do not emit light, the reflectors are able to reflect lights generated from the circumferential LEDs 224. Thus lights are still emitted from where the connectors 228 and the FFCs 240 positioned in the light-emitting region 250.

Figure 4:
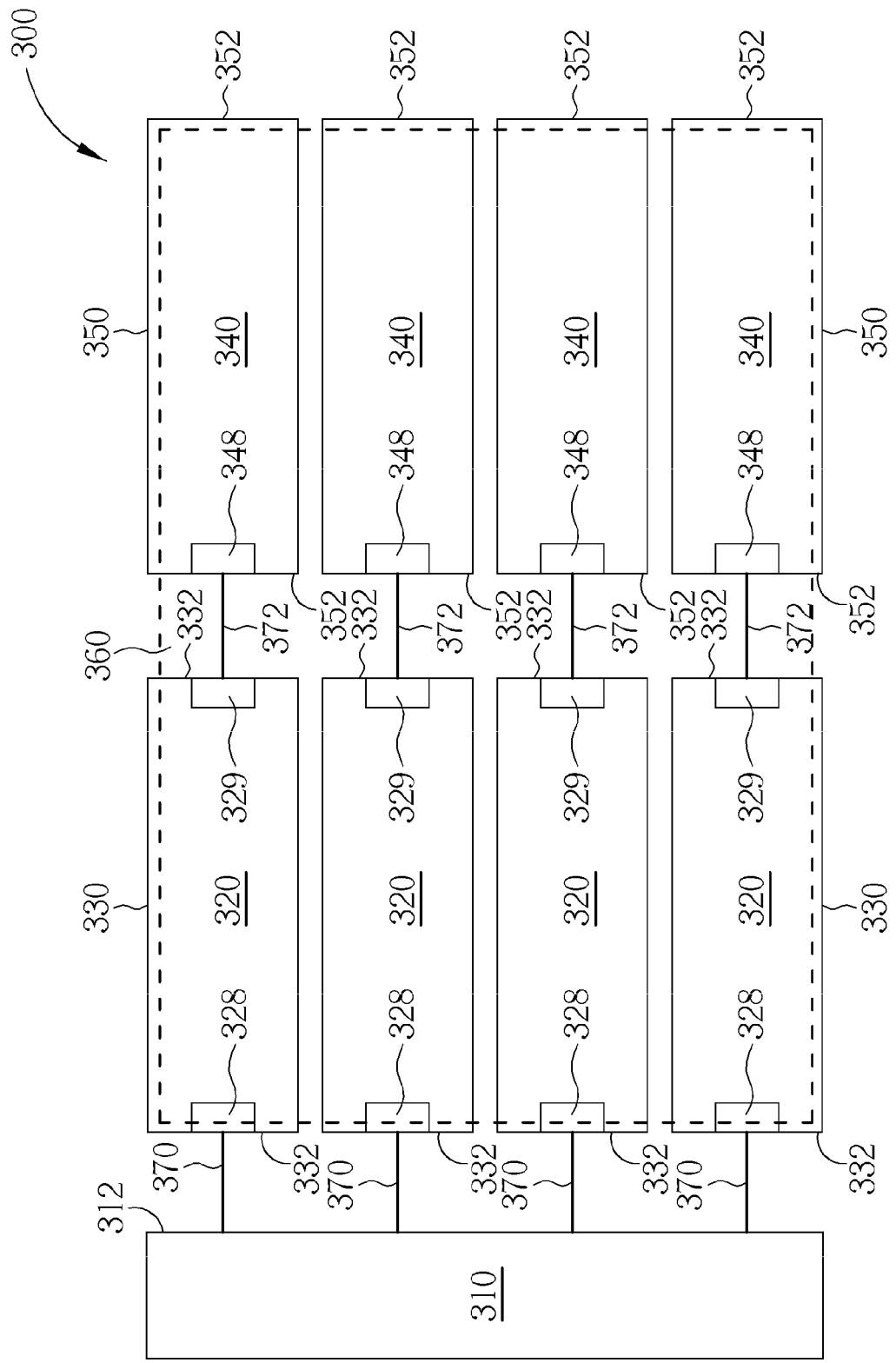
FIG. 4 is a schematic diagram illustrating connections of an LED module provided by a second preferred embodiment of the present invention.
Figure 5:
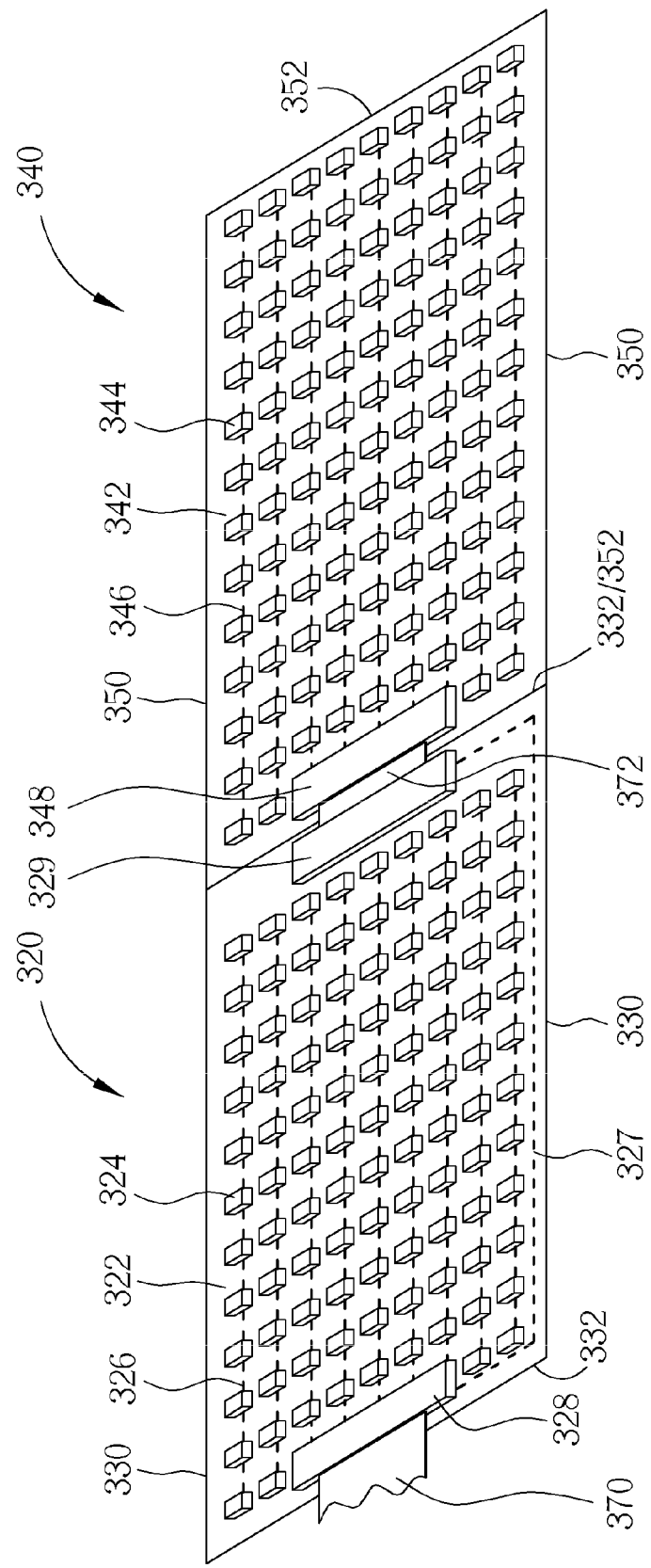
FIG. 5 is a schematic diagram of a portion of the LED module of the second preferred embodiment.

Please refer to FIGS. 4-5, FIG. 4 is a schematic diagram illustrating connections of an LED module provided by a second preferred embodiment of the present invention; FIG. 5 is a schematic diagram of a portion of the LED module of the second preferred embodiment. As shown in FIG. 4, the provided LED module 300 comprises a converter 310 having a first side 312, a first LED unit 320 and a second LED unit 340.

The first LED unit 320 comprises a first circuit board 322 having a first circuit layout 326 and a second circuit layout 327. A plurality of LEDs 324, a first connector 328 and a second connector 329 are positioned on the first circuit board 322. The LEDs 324 are mounted on the first circuit board 322 by SMT and electrically connected to the first connector 328 by the first circuit layout 326. The first circuit board 322 of the first LED unit 320 further comprises a pair of second sides 330 and a pair of third sides 332. The second sides 330 are perpendicular to the first side 312 of the converter 310 and the third sides 332 are parallel to the first side 312 of the converter 310. In the second preferred embodiment, the first connector 328 and the second connector 329 are positioned on the third sides 332 of the first circuit board 322, respectively. The first connector 328 is positioned on the third side 332 adjacent to the converter 310 while the second connector 329 is positioned on the third side 332 adjacent to the second LED unit 340 as shown in FIG. 4.

Please still refer to FIGS. 4-5. The second LED unit 340 comprises a second circuit board 342 having a third circuit layout 346. A plurality of LEDs 344 and a third connector 348 are positioned on the second circuit board 342. The LEDs 344 are mounted on the second circuit board 342 by SMT as mentioned above and electrically connected to the third connector 348 by the third circuit layout 346. The second circuit board 342 of the second LED unit 340 further comprises a pair of second sides 350 and a pair of third sides 352. The second sides 350 are perpendicular to the first side 312 of the converter 310 and the third sides 352 are parallel to the first side 312 of the converter 310. In the third preferred embodiment, the third connector 348 is positioned on the third side 352 adjacent to the first LED unit 320.

In the second preferred embodiment, the LED module 300 comprises a light-emitting region 360 having the first LED unit 320 and second LED unit 340 positioned therein. As shown in FIG. 4, the first LED unit 320 is positioned between the second LED unit 340 and the converter 310. According to this motif, the first LED unit 320 and the second LED unit 340 are repetitively arranged in the light-emitting region 360, thus a rectangular array is obtained. The LED module 300 further comprises a first FFC 370 electrically connecting the first connector 328 to the converter 310 and a second FFC 372 electrically connecting the third connector 348 to the second connector 329. It is noteworthy that, as shown in FIG. 5, the second connector 329 is electrically connected to the first connector 328 by the second circuit layout 327 of the first LED unit 320 and further electrically connected to the converter 310 by the first connector 328 and the first FFC 370. In detail, the LEDs 324 of the first LED unit 320 are electrically connected to first connector 328 by the first circuit layout 326, and to the converter 310 by the first FFC 370 for obtaining electricity supply. The LEDs 344 of the second LED unit 340 are electrically connected to the third connector 348 by the third circuit layout 346, the third connector 348 is electrically connected to the second connector 329 by the second FFC 372, the second connector 329 is electrically connected to the first connector 328 by the second circuit layout 327, and to the converter 310 by the first FFC 370 for obtaining electricity supply. Accordingly, the length of the FFC used to electrically connect the second LED units 340 and the converter 310 is reduced.

Figure 6:
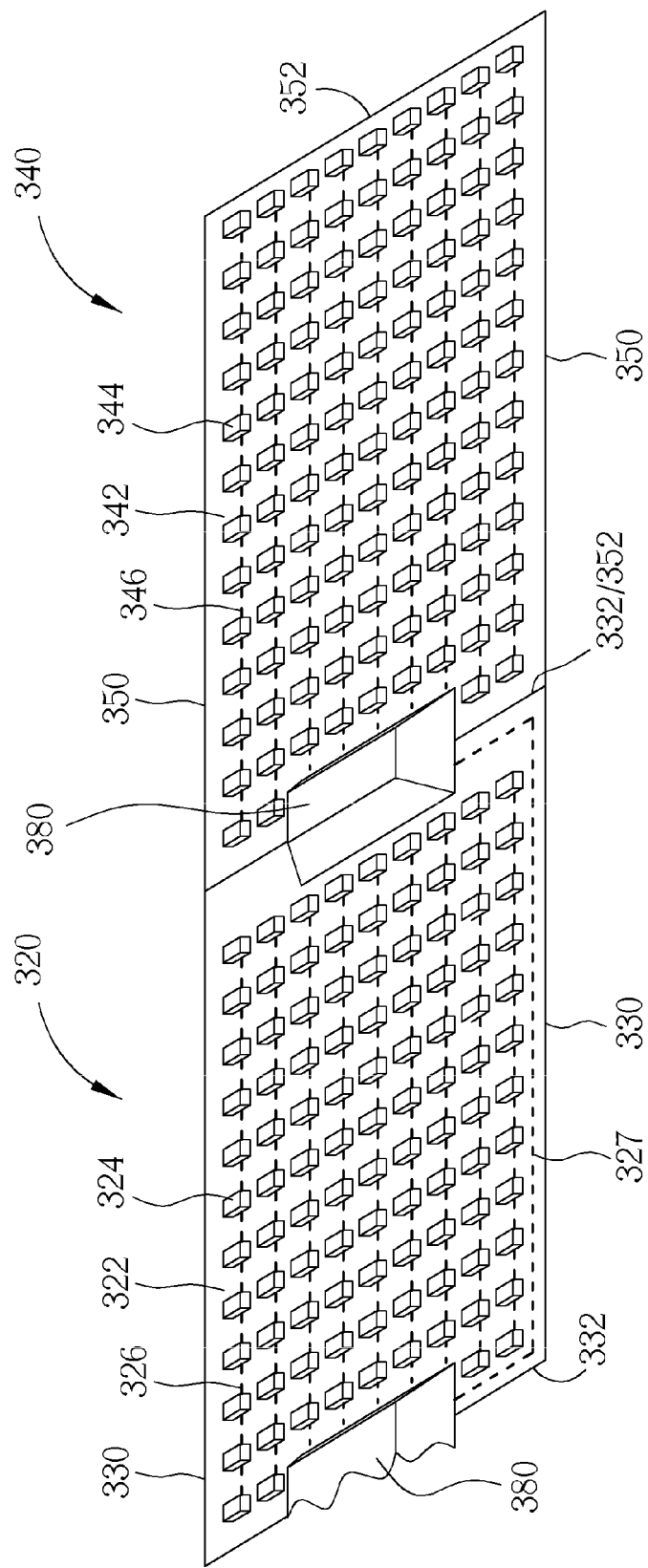
FIG. 6 is a schematic diagram of a portion of the LED module of FIG. 4 applied with a reflector.

Additionally, please refer to FIGS. 4-6, FIG. 6 is a schematic diagram of a portion of the LED module 300 of FIG. 4 applied with a reflector. As shown in FIG. 4, since the first connector 328, the second connector 329, the third connector 348, and the second FFC 372 do not generate lights, a plurality of reflectors 380 are required to cover the first connector 328, the second connector 329, the third connector 348, and the second FFC 372 in the light-emitting region 360. The reflector 380 is step-shaped as shown in FIG. 6, but it is not limited to have shapes such sphere or pyramid-shaped for improving scattering. By adopting the reflectors 380, light generated by the circumferential LEDs 324/344 can be reflected from where the first connector 328, the second connector 329, the third connector 348, and the second FFC 372 that do not generate lights are positioned. Therefore no shades are found in the light-emitting region 360 where the first connector 328, the second connector 329, the third connector 348, and the second FFC 372 are positioned.

According to the second preferred embodiment, two modularized LED units are provided. Thus different arrangements for different requirement of sizes are achieved while the provided LED module still supports mass modular production. Furthermore, the length of the FFC is substantially reduced. Consequently, cost and electricity consumption are both reduced. In addition, the optical performance of the LED module provided by the present invention is not influenced by positioning the reflectors.

Figure 7:
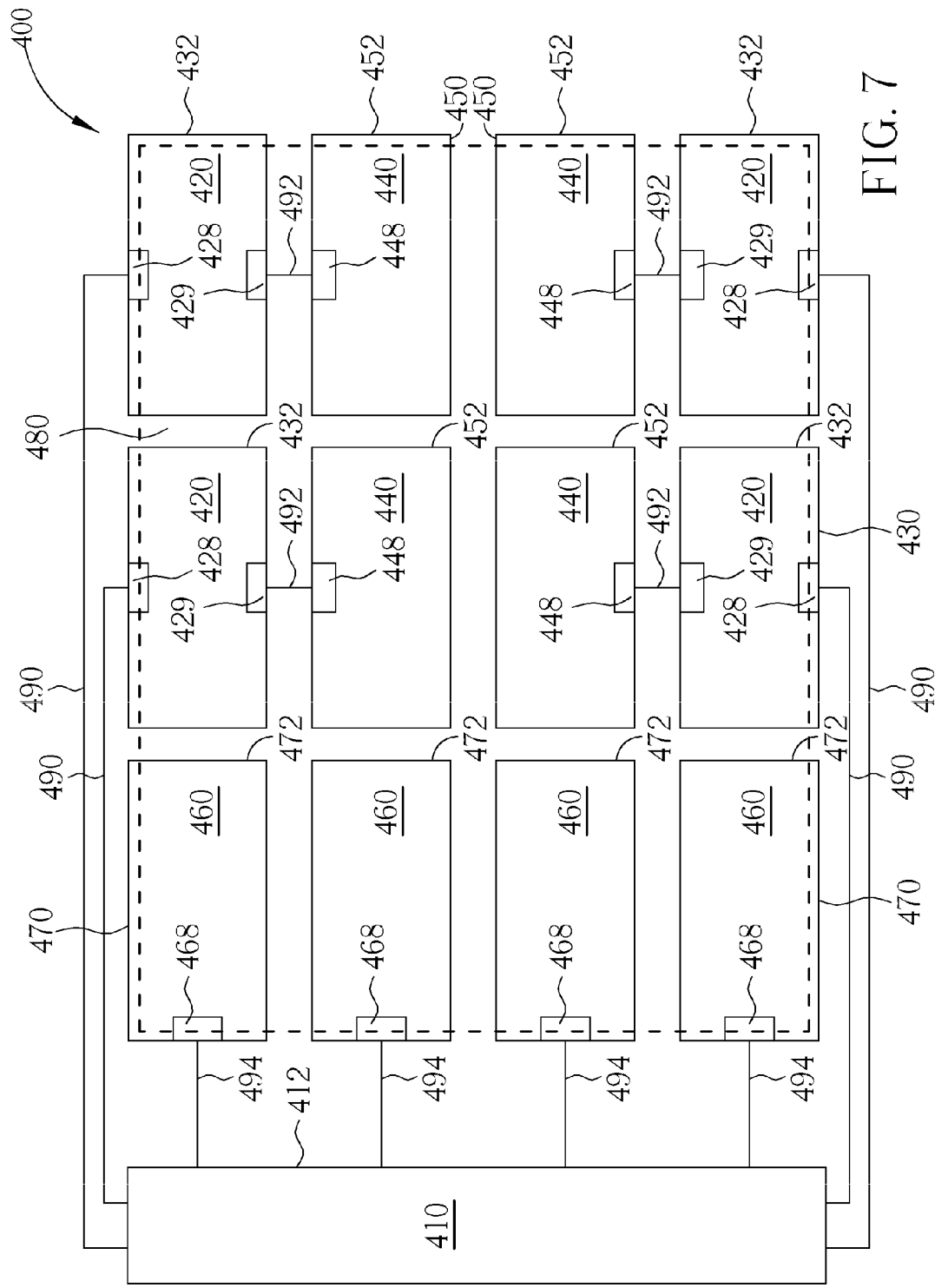
FIG. 7 is a schematic diagram illustrating connections of an LED module provided by a third preferred embodiment of the present invention.
Figure 8:
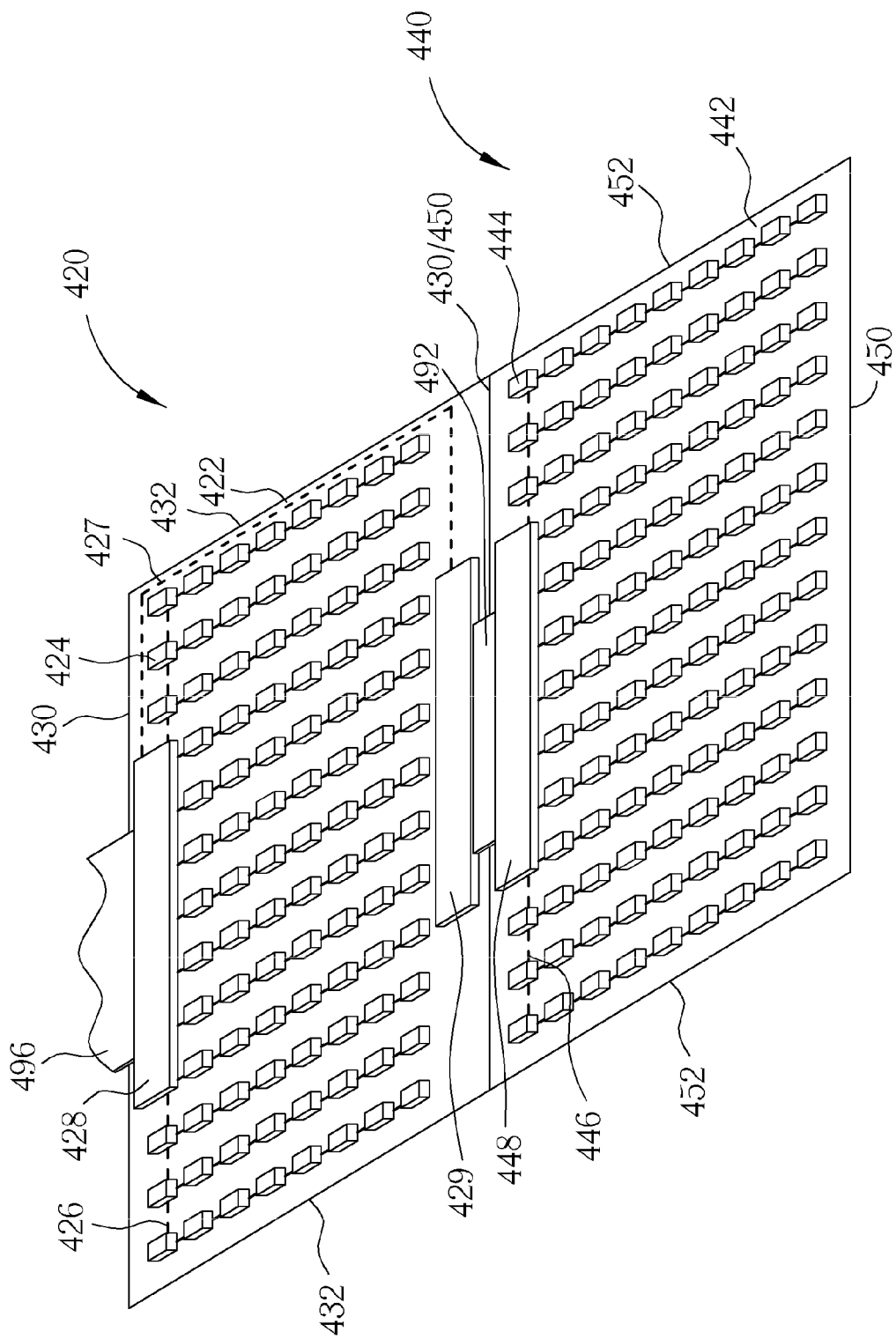
FIG. 8 is a schematic diagram of a portion of the LED module of the third preferred embodiment.

Please refer to FIGS. 7-8, FIG. 7 is a schematic diagram illustrating connections of an LED module provided by a third preferred embodiment of the present invention; FIG. 8 is a schematic diagram of a portion of the LED module of the third preferred embodiment. As shown in FIG. 7, the provided LED module 400 comprises a converter 410 having a first side 412, a first LED unit 420, a second LED unit 440, and a third LED unit 460. As shown in FIG. 8, the first LED unit 420 comprises a first circuit board 422 having a first circuit layout 426 and a second circuit layout 427. A plurality of LEDs 424, a first connector 428, and a second connector 429 are positioned on the first circuit board 422. The LEDs 424 are mounted on the first circuit board 422 by SMT and electrically connected to the first connector 428 by the first circuit layout 426. The first circuit board 422 of the first LED units 420 comprises a pair of second sides 430 and a pair of third sides 432. The second sides 430 are perpendicular to the first side 412 of the converter 410 and the third sides 432 parallel to the first side 412 of the converter 410. In the third preferred embodiment, the first connector 428 and the second connector 429 are positioned on the second sides 430 of the first circuit board 422, respectively. As shown in FIG. 7 and FIG. 8, the second connector 429 is positioned on the second side 430 adjacent to the second LED unit 440.

Please still refer to FIGS. 7-8. The second LED unit 440 comprises a second circuit board 442 having a third circuit layout 446. A plurality of LEDs 444 and a third connector 448 are positioned on the second circuit board 442. As mentioned above, the LEDs 444 are mounted on the second circuit board 442 by SMT and electrically connected to the third connector 448 by the third circuit layout 446. The second circuit board 442 of the second LED unit 440 further comprises a pair of second sides 450 and a pair of third sides 452. The second sides 450 are perpendicular to the first side 412 of the converter 410 and the third sides 452 are parallel to the first side 412 of the converter 410. In the third preferred embodiment, the third connector 448 is positioned on the second side 450 adjacent to the first LED unit 420.

The third LED unit 460 of the LED module 400 provided by the third preferred embodiment comprises a third circuit board having a fourth circuit layout. A plurality of LEDs and a fourth connector 468 are positioned on the third circuit board. Because the details of the fourth circuit layout and the LEDs are substantially same with that of the second LED unit 340 of the second preferred embodiment, those details are omitted herein for simplicity. The LEDs are mounted on the third circuit board by SMT as mentioned above and electrically connected to the fourth connector 468 by the fourth circuit layout. The third circuit board of the third LED unit 460 further comprises a pair of second sides 470 and a pair of third sides 472. The second sides 470 are perpendicular to the first side 412 of the converter 410 and the third sides 472 are parallel to the first side 412 of the converter 410. In the third preferred embodiment, the fourth connector 468 is positioned on the third side 472 adjacent to the converter 410.

In the third preferred embodiment, the LED module 400 further comprises a light-emitting region 480, and the first LED unit 420, the second LED unit 440, and the third LED unit 460 are positioned in a rectangular array in the light-emitting region 480. One first LED unit 420 and one second LED unit 440 are defined in a group and positioned in a line parallel to the first side 412 of the converter 410. As shown in FIG. 7, in each group, the first LED unit 420 is positioned adjacent to a peripheral region of the light-emitting region 480. It is noteworthy that, the third LED units 460 are positioned in a line adjacent to the converter 410.

The LED module 400 further comprises a first FFC 490 electrically connecting the first connector 428 to the converter 410 and a second FFC 492 electrically connecting the third connector 448 to the second connector 429. It is noteworthy that the second connectors 429 are electrically connected to the first connectors 428 respectively by the second circuit layouts 427 of the first LED units 420, and to the converter 410 by the first connectors 428 and the first FFCs 490. In addition, the LED module 400 further comprises a third FFC 494 electrically connecting the fourth connector 468 of the third LED unit 460 to the converter 410.

In detail, the LEDs 424 positioned on the first LED unit 420 are electrically connected to the first connector 428 by the first circuit layout 426, and to the converter 410 by the first FFC 490 for obtaining electricity supply. The LEDs of the third LED units 460 are electrically connected to the fourth connector 468 by the fourth circuit layout, and to the converter 410 by the third FFC 494 for obtaining electricity supply. The LEDs 444 of the second LED unit 440 are electrically connected to the third connector 448 by the third circuit layout 446, the third connector 448 is electrically connected to the second connector 429 by the second FFC 492, the second connector 429 is electrically connected to the first connector 428 by the second circuit layout 427, and to the converter 410 by the first FFC 490 for obtaining electricity supply. Accordingly, long FFC is avoided.

As mentioned above, the first connector 428, the second connector 429, the third connector 448, the fourth connector 468, and the second FFC 492 that do not generate lights are positioned in the light-emitting region 480, therefore the LED module 400 further comprises a plurality of reflectors respectively covering the first connector 428, the second connector 429, the third connector 448, the fourth connector 468, and the second FFC 492 as shown in FIG. 6. The reflectors can be a step-shaped, but it is not limited to be sphere or pyramid-shaped. By applying the reflectors, lights are reflected from the circumferential LEDs 424 and 444 around the first connector 428, the second connector 429, the third connector 448, the fourth connector 468, and the second FFC 492 in the light-emitting region 480. Therefore, lights are still emitted from where the first connector 428, the second connector 429, the third connector 448, the fourth connector 468, and the second FFC 492 are positioned.

According to the third preferred embodiment, three modularized LED units are provided. Thus different arrangements for different requirement of sizes are achieved while the provided LED module still supports mass modular production.

Furthermore, the length of the FFC is substantially reduced. Consequently, cost and electricity consumption are both reduced. In addition, the optical performance of the LED module provided by the present invention is not influenced by positioning the reflectors.

According to the LED module provided by the present invention, no matter the LED units are light plates or plight bars, length of the required FFCs are substantially reduced, thus reliability of the LED module is improved while the provided LED module still supports mass modular production. When large-scale application or different assembly for the LED units is required, the provided LED module is more flexible in modification by arranging different modularized LED units.

Those skilled in the art will readily observe that numerous modifications and alterations of the device and method may be made while retaining the teachings of the invention.

What is claimed is:

1. A light-emitting diode (LED) module comprising:
  a converter having a first side;
  a plurality of LED units, each of the LED units comprising:
    a circuit board, having a second side perpendicular to the first side and a third side parallel to the first side;
    a plurality of LEDs positioned on the circuit board; and
    a connector positioned proximal to the converter on the second side of the circuit board and electrically connected to the LEDs; and
  a plurality of flexile flat cables (FFCs) electrically connecting the connectors to the converter, respectively;
  wherein the LEDs and the connector are positioned on a same surface of the circuit board.

2. The LED module of claim 1 further comprising a light-emitting region, and the LED units are arranged in a rectangular array in the light-emitting region.

* * * * *